(12) United States Patent
Zhang et al.

(10) Patent No.: US 10,218,188 B2
(45) Date of Patent: *Feb. 26, 2019

(54) STRING CURRENT LIMITED BATTERY CHARGING CONTROL

(71) Applicant: General Electric Company, Schenectady, NY (US)

(72) Inventors: Jiucai Zhang, Arvada, CO (US); Charles Clarence Hicks, Jr., Loundonville, NY (US); Sam T. Liu, Niskayuna, NY (US); Robert A. Kaucic, Niskayuna, NY (US); Leng Mao, Latham, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,813

(22) Filed: Apr. 17, 2017

(65) Prior Publication Data

US 2017/0222452 A1    Aug. 3, 2017

Related U.S. Application Data

(63) Continuation of application No. 14/528,013, filed on Oct. 30, 2014, now Pat. No. 9,627,897.

(51) Int. Cl.
*H02J 7/00* (2006.01)
*H02J 7/04* (2006.01)
*G01R 31/36* (2019.01)

(52) U.S. Cl.
CPC ........ *H02J 7/0009* (2013.01); *G01R 31/3634* (2013.01); *H02J 7/007* (2013.01); *H02J 7/0013* (2013.01); *H02J 7/0021* (2013.01); *H02J 7/0022* (2013.01); *H02J 7/0024* (2013.01); *H02J 7/0047* (2013.01); *H02J 7/0052* (2013.01); *H02J 7/045* (2013.01); *H02J 2007/005* (2013.01)

(58) Field of Classification Search
CPC ........ H02J 7/024; H02J 7/0021; H02J 7/0022; H02J 7/0013; H02J 7/0016; H02J 7/007; H02J 7/0009; H02J 2007/0001; G01R 31/3634
USPC .............................. 320/117, 126; 307/31, 32
See application file for complete search history.

(56) References Cited

U.S. PATENT DOCUMENTS

| | | |
|---|---|---|
| 4,502,001 A | 2/1985 | Galloway |
| 5,917,308 A | 6/1999 | Brooke |
| 6,915,220 B2 | 7/2005 | Cardinal et al. |

(Continued)

*Primary Examiner* — Nathaniel R Pelton
*Assistant Examiner* — Michael N Dibenedetto
(74) *Attorney, Agent, or Firm* — Dority & Manning, P.A.

(57) ABSTRACT

Systems and methods for charging a plurality of battery strings are provided. The individual string current of each of the individual battery strings can be monitored and used to regulate a charging output provided by the charger. For instance, the output voltage of charger can be controlled as part of a closed loop control system based on the individual string current of the battery string under the constraint of an individual string current limit and/or a charging voltage limit. As the charging voltage of the charger increases as a result of the closed loop control based on the individual string current, other battery strings can be coupled to the charger when the charging voltage provided by the charger exceeds a battery string voltage associated with the battery string.

12 Claims, 4 Drawing Sheets

(56) References Cited

U.S. PATENT DOCUMENTS

| | | | |
|---|---|---|---|
| 7,064,521 B2* | 6/2006 | Stanesti | H02J 7/0018 320/126 |
| 7,642,748 B2 | 1/2010 | Glosser, Jr. et al. | |
| 8,643,334 B2* | 2/2014 | Kuo | H02J 7/0019 320/116 |
| 8,803,479 B2* | 8/2014 | Kim | H01M 10/4207 320/126 |
| 2012/0077061 A1* | 3/2012 | Ohms | H01M 2/0262 429/53 |
| 2013/0285611 A1* | 10/2013 | Arakawa | H01M 2/204 320/126 |
| 2013/0285612 A1* | 10/2013 | Okuda | H02J 7/0016 320/126 |

* cited by examiner

STRING CURRENT LIMITED BATTERY CHARGING CONTROL

PRIORITY CLAIM

The present application is a continuation of U.S. application Ser. No. 14/528,013 having a filing date of Oct. 30, 2014. Applicants claim priority to and benefit of all such applications and incorporate all such applications herein by reference.

FIELD OF THE INVENTION

The present subject matter relates generally to battery power systems and, more particularly, to systems and methods for charging a plurality of battery strings in a battery power system.

BACKGROUND OF THE INVENTION

Battery power systems can include one or more strings of batteries electrically coupled in a parallel or series configuration to facilitate increasing the power that is available to the system in which the batteries are connected. The battery strings can be connected to a charger that charges the battery strings for use in a battery power system. Overcharging a battery can damage the battery and/or reduce the effective operational life of the battery. Undercharging a battery can reduce the time the battery can be utilized in the system.

Existing systems for connecting multiple battery strings to a charger can include the use of open loop controls to synchronously connect all battery strings to the charger with a constant voltage charge or constant current followed by a constant voltage charge. Recharging the battery with a constant voltage or a constant current followed by a constant voltage may control the charging of the battery strings to keep the overall battery system current within a given limit, without taking into account the current limit of each individual battery string within the battery system. Other systems can include a step incremental voltage control that increases the voltage of the charger to a certain limit after a specified time period or can include ramping the battery voltage within given current limits. However, this does not provide for closed loop control and can require a long response time to connect the multiple battery strings to the charger. Additionally, this type of control of battery charging can result in an override of an individual current limit for a battery string.

Thus, a need exists for improved systems and methods for connecting multiple battery strings to a charger. Systems and methods that can provide for closed loop control that is sensitive to a string current limit for each of the plurality of battery strings while shortening connection and recharge times would be particularly useful.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a battery system. The battery system can include a plurality of battery strings. Each battery string can include one or more batteries or battery cells. The system can include a plurality of battery string contactors. Each battery string contactor can be associated with at least one of the plurality of battery strings. The system can include a charger operable to provide a charging voltage to each of the plurality of battery strings via the battery string contactor associated with the battery string. The system can further include one or more control devices configured to control a charging output of the charger based at least in part on a string current of at least one of the plurality of battery strings. The one or more control devices can be configured to control the plurality of battery string contactors to couple each of the battery strings to the charger when a charging voltage of the charger exceeds a battery string voltage associated with the battery string.

Another example aspect of the present disclosure is directed to a method for connecting a plurality of battery strings to a charger. The method includes coupling a first battery string of a plurality of battery strings to a charger and monitoring a string current for the first battery string. The method can further include controlling, by one or more control devices, a charging voltage provided by the charger based at least in part on the string current for the first battery string. The method can further include coupling one or more second battery strings to the charger when a voltage of the second string is less than the charging voltage provided by the charger.

Yet another example aspect of the present disclosure is directed to a smart charger system. The smart charger system can include a charger operable to provide a charging voltage to each of the plurality of battery strings via a contactor coupled in series with the battery string. The system can further include one or more string current sensors. Each string current sensor can be configured to monitor a string current of one or more of the plurality of battery strings. The system can further include a controller configured to control the charging voltage of the charger based at least in part on the string current of one or more of the plurality of battery strings to keep the string current less than or equal to a maximum string current limit. The controller can be configured to sequentially couple the charger to the plurality of battery strings based at least in part on the charging voltage of the charger such that the charger is coupled to each battery string when the charging voltage exceeds a battery string voltage associated with the battery string.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Figure 1:
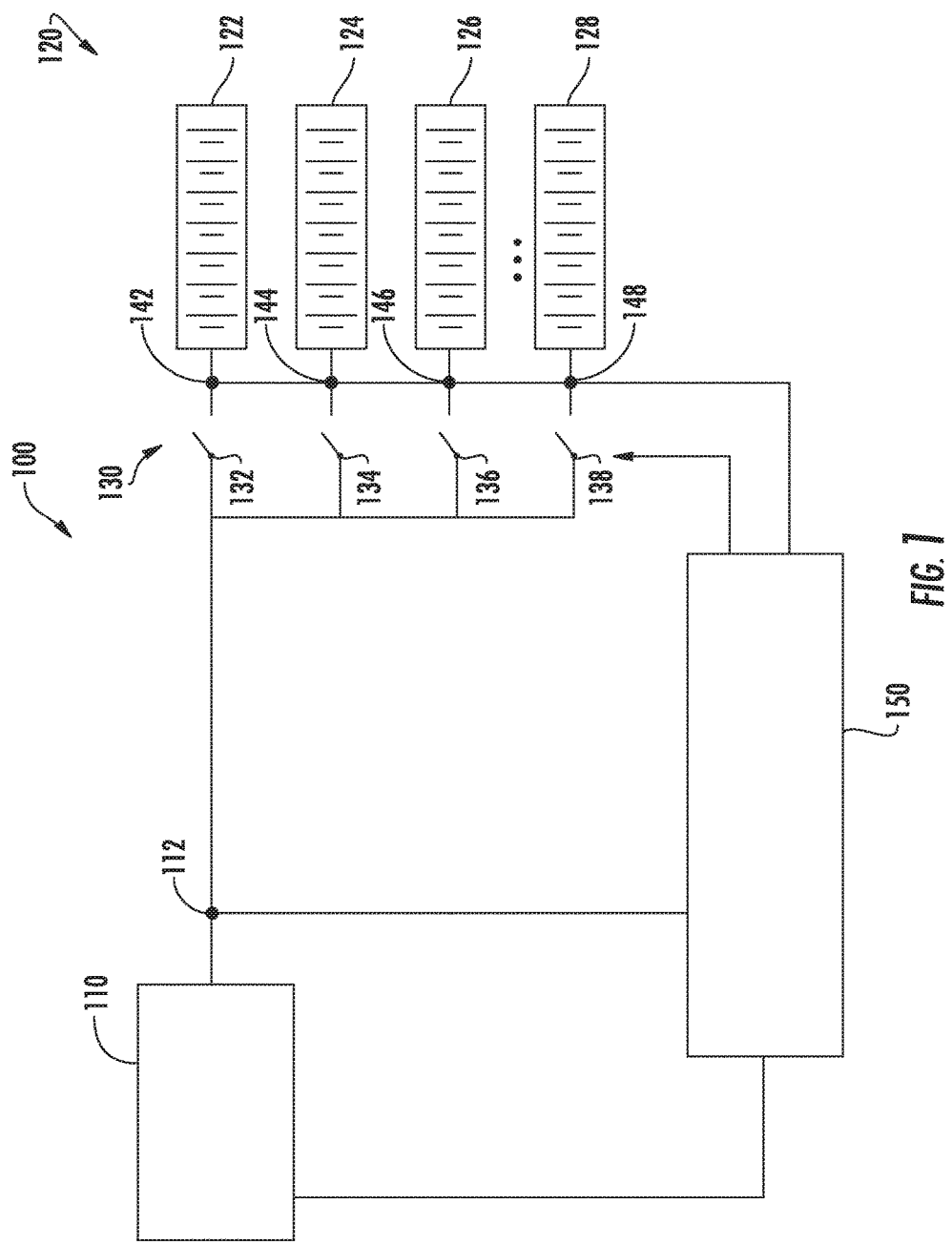
FIG. 1 depicts an example battery system according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to systems and methods for charging a plurality of battery strings in a battery system. A battery string can include one or more batteries or battery cells connected in a series or parallel configuration. A charger can be coupled to the battery strings by operating a battery string contactor coupled in series between the charger and each of the individual battery strings. The individual string current of each of the individual battery strings can be monitored and used to regulate the charger. For instance, a charging output (e.g. a charging voltage or a charging current) can be regulated based at least in part on a max string current of the individual string currents of the individual battery strings.

According to particular aspects of the present disclosure, the plurality of battery strings can be disconnected from the charger, for instance, by controlling the contactors coupled in series with each of the plurality of battery strings to be in an open state. The battery string with the lowest battery string voltage can be coupled to the charger to start charging the battery string with the lowest battery string voltage, for instance, by closing the contactor associated with the battery string.

The output voltage of charger can be controlled as part of a closed loop control system based on the individual string current of the battery string under the constraint of an individual string current limit and/or a charging voltage limit. Instead of heuristically using an open loop to adjust the battery charger voltage to limit each individual voltage within the battery current limits, the battery charger output can be accurately controlled based at least in part on the feedback of the maximum string current, for instance, through an over-damping control method. More particularly, the maximum current of the plurality of string currents can strictly follows the maximum current limits. This can increase the speed of the battery charging while maintaining safety and useful life of the battery.

To avoid overshoot of the charging current at the beginning of charging process, the initial voltage of charger should be set to a minimum string voltage. As the charging voltage of the charger increases, battery strings can be coupled to the charger when the charging voltage of the charger exceeds a battery string voltage associated with the battery string. For instance, the contactors associated with the battery strings can be controlled to sequentially couple the battery strings to the charger in ascending order of battery string voltage as the charging voltage increases. When the charging voltage of the charger reaches a charging voltage limit, the charging voltage of the charger can be held at or near the charging voltage limit.

Coupling the plurality of battery strings to a charger based at least in part individual string current according to example aspects of the present disclosure can avoid inrush current and circulating current between the plurality of battery strings. In addition, overcharging as a result of large string current can be reduced. As a result, the performance of the battery system in terms of safety and useable life can be improved. This can provide significant commercial advantages by reducing maintenance effort and cost of the battery system.

FIG. 1 depicts an example battery system 100 according to example aspects of the present disclosure. The battery system 100 can include a plurality of battery of strings 120, including battery string 122, battery string 124, battery string 126, and battery string 128. Four battery strings 120 are depicted in the system 100 for purposes of illustration and discussion. More or fewer battery strings 120 can be included in the system 100 without deviating from the scope of the present disclosure.

Each of the plurality of battery strings 120 can include one or more batteries or battery cells. The one or more batteries or battery cells can include at least one of a lithium ion battery, a sodium nickel chloride battery, a sodium sulfur battery, a nickel metal hydride battery, a nickel cadmium battery, or other suitable battery. The one or more batteries or battery cells can be coupled in a parallel or series configuration to increase the output of the battery system 100. The battery strings 120 can be used in a variety of applications. For instance, the battery strings 120 can be coupled to an inverter to convert DC power provided by the battery strings to AC power for supply to a utility grid or other AC application.

The system 100 can include a charger 110 configured to provide a charging output to periodically charge the plurality of battery strings 120. As shown, the charger can be coupled to the plurality of battery strings 120 via a plurality of contactors 130 coupled in series with the plurality of battery strings. For example, charger 110 can be coupled to battery string 122 with contactor 132. Charger 110 can be coupled to battery string 124 with contactor 134. Charger 110 can be coupled to battery string 126 with contactor 136. Charger 110 can be coupled to battery string 128 with contactor 138.

The system 100 can include a control system 150 configured to control various aspects of the system 100, including controlling the charging of the plurality of battery strings 120 with the charger 110. The control system 150 can include one or more control devices, such as sensors, controllers, processors, etc. that can monitor various aspects of the system 100 and control charging of the battery strings 120. In a particular implementation, the control system 150 can include one or more control devices implemented as part of or in conjunction with the charger 110 to provide a smart charger system 110.

The control system 150 can monitor the individual string current of each of the plurality of battery strings 120 using one or more current sensors. For instance, the control system 150 can monitor the string current of battery string 122 using sensor 142. The control system 150 can monitor the string current of battery string 124 using sensor 144. The control system 150 can monitor the string current of battery string 126 using sensor 146. The control system 150 can monitor the string current of battery string 128 using sensor 148. Additionally, the control system 150 can monitor the charging voltage of the charger 110 using a sensor 112.

According to example aspects of the present disclosure, the control system 150 can regulate the charging output of the charger 110 based on the individual string current of each of the battery strings 120. The control system 150 can control the contactors 130 to couple the charger 110 to each of the battery strings 120 when a charging voltage provided by the charger exceeds a battery string voltage associated with the battery string.

Figure 2:
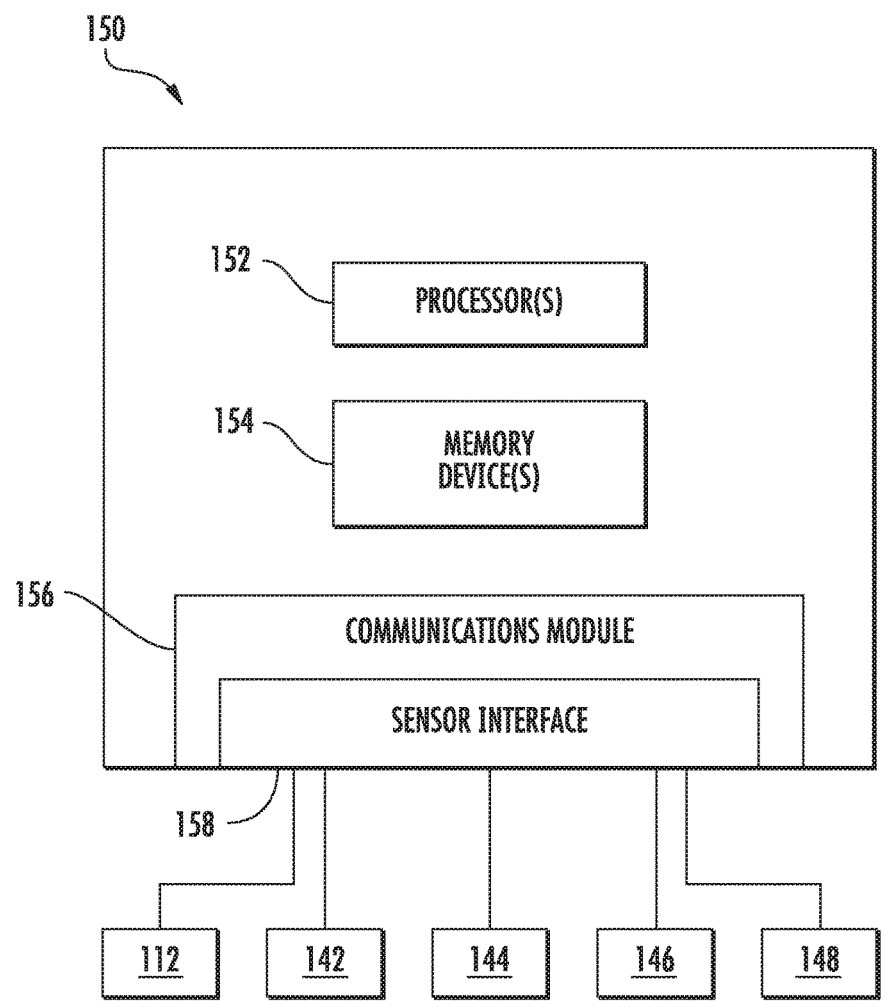
FIG. 2 depicts an example control system for controlling the charging of a plurality of battery strings according to example embodiments of the present disclosure.

Referring to FIG. 2, an example control system 150 can include any number of control devices. As shown, for example, the control system 150 can include one or more processor(s) 152 and associated memory device(s) 154 configured to perform a variety of computer-implemented functions and/or instructions (e.g., performing the methods, steps, calculations and the like and storing relevant data as disclosed herein). The instructions when executed by the one or more processors 152 can cause the one or more processors 152 to perform operations, including providing control commands to the charger 110, the contactors 130, the battery strings 120 and/or other aspects of the system 100.

Additionally, the control system 150 can also include a communications module 156 to facilitate communications between the control system 150 and the various components of the system 100. Further, the communications module 156 may include a sensor interface 158 (e.g., one or more analog-to-digital converters) to permit signals transmitted from one or more sensors to be converted into signals that can be understood and processed by the one or more processors 152. It should be appreciated that the sensors (e.g. sensors 112, 142, 144, 146, 148) may be communicatively coupled to the communications module 156 using any suitable means. For example, as shown in FIG. 2, the sensors 112, 142, 144, 146, and 148 are coupled to the sensor interface 158 via a wired connection. However, in other embodiments, the sensors may be coupled to the sensor interface 158 via a wireless connection, such as by using any suitable wireless communications protocol known in the art. As such, the processor 152 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The one or more processors 152 can also be configured to compute advanced control algorithms.

Additionally, the memory device(s) 175 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 154 may generally be configured to store suitable computer-readable instructions that, when implemented by the processor(s) 152, configure the control system 150 to perform the various functions as described herein.

Figure 3:
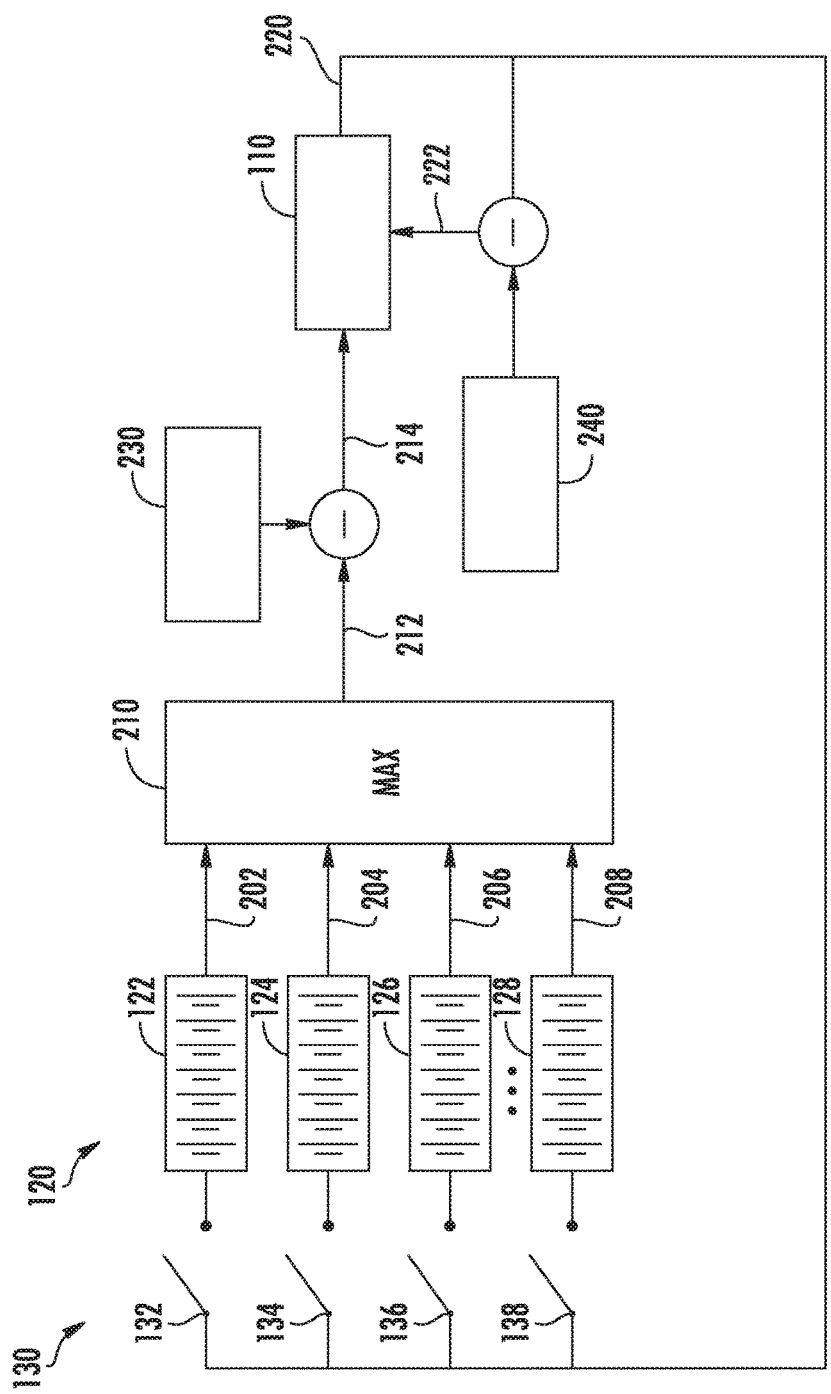
FIG. 3 depicts an example control topology for controlling the charging of a plurality of battery strings according to example aspects of the present disclosure.

FIG. 3 depicts an example control topology of a system for controlling the charging of a plurality of battery strings according to example aspects of the present disclosure. More particularly, the contactors 130 can be controlled to be in an open state for all battery strings 120 prior to charging the plurality of battery strings. The contactor 130 associated with the battery string 120 having a lowest battery string voltage can be closed to couple the charger 110 to the battery string 120. The charger can be controlled to provide a charging voltage 220 based on the individual string current associated with the battery string 120.

For example, signals representative of the string currents 202, 204, 206, 208 for each of the plurality battery strings 120 can be provided to a node 210 that determines the max string current. A signal 212 indicative of the max string current can be compared with a string current limit 230 to determine an error signal 214. The error signal 214 can be used to regulate the charging voltage 220 of the charger 110 to keep the maximum string current less than the string current limit 220. In specific implementations, the charging voltage 220 can also be compared with a charging voltage limit 240 to determine an error signal 222. The error signal 222 can be also be used to regulate the charging voltage 220 to keep the charging voltage 220 less than the charging voltage limit 240.

As the charging voltage 220 increases, the contactors 130 can be controlled to couple the individual battery strings 120 to the charger 110. More specifically, the contactors 130 can be controlled to couple the charger 110 to a specific battery string 120 when the charging voltage 220 exceeds a battery string voltage associated with the specific battery string 120. For example, contactor 132 can be closed when the charging voltage 220 exceeds the battery string voltage associated with battery string 122. Contactor 134 can be closed when the charging voltage 220 exceeds the battery string voltage associated with battery string 124. Contactor 136 can be closed when the charging voltage 220 exceeds the battery string voltage associated with battery string 126. Contactor 138 can be closed when the charging voltage 220 exceeds the battery string voltage associated with battery string 128.

In particular implementations, the battery strings 120 can be sequentially coupled in ascending order of battery string voltage. More particularly, the charging voltage 220 can increase as a result of the control of the charging voltage 220 based at least in part on the string current of the individual battery strings. The charger 110 is coupled to specific battery strings 120 when the charging voltage 220 exceeds the battery string voltage associated with the specific battery string 120. In this way, the charging of the plurality of battery strings 120 can be controlled in a manner that takes into account the individual string currents of each of the plurality of battery strings 120.

Figure 4:
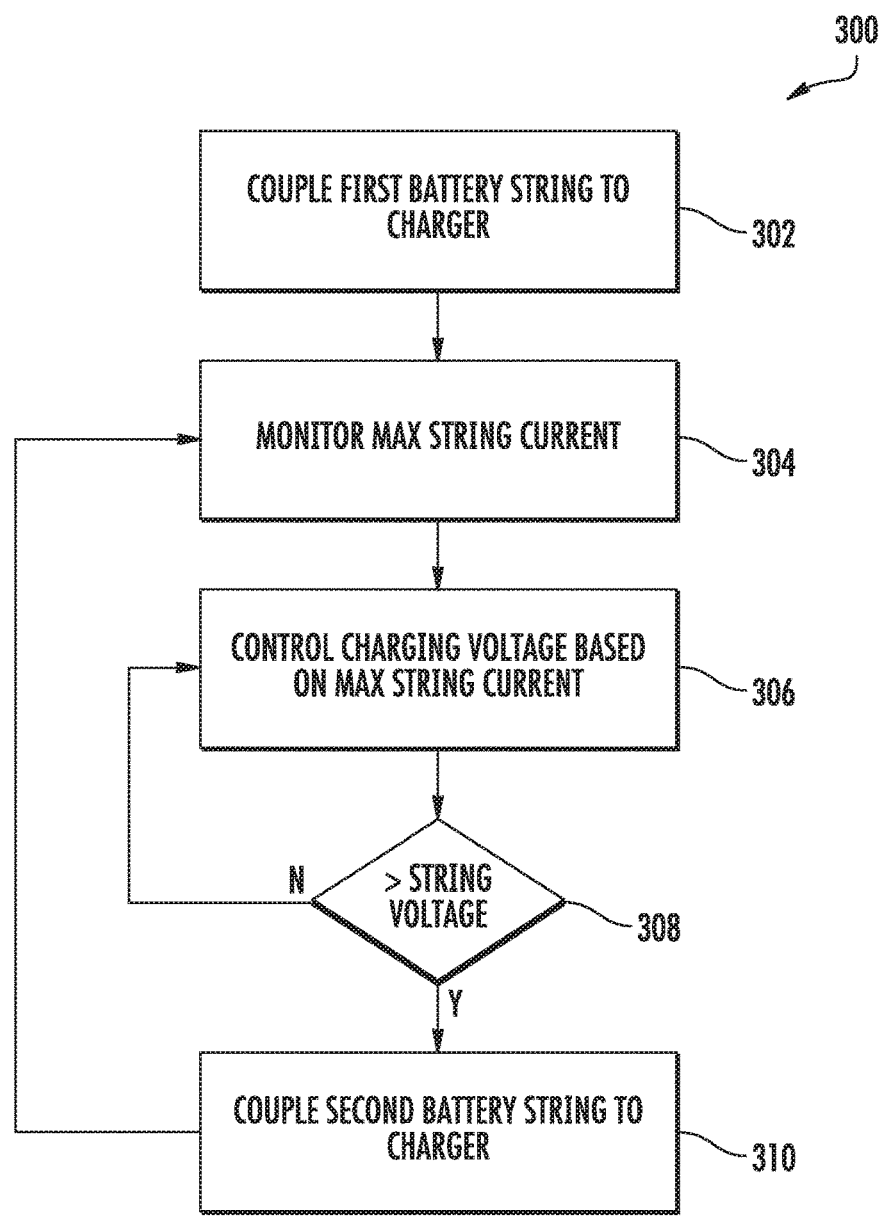
FIG. 4 depicts a flow diagram of an example method according to example aspects of the present disclosure.

FIG. 4 depicts a flow diagram of an example method (300) according to example aspects of the present disclosure. FIG. 4 depicts steps performed in a particular order for purposes of illustration and discussion. Those of ordinary skill in the art, using the disclosures provided herein, will understand that the various steps of any of the methods discussed herein can be modified, expanded, rearranged, omitted, and/or adapted in various ways without deviating from the scope of the present disclosure.

At (302), the method includes coupling a first battery string to a charger. For instance, a contactor coupled in series between a charger and the first battery string can be closed to couple the charger to the first battery string. The first battery string can be a battery string having a lowest battery string voltage of a plurality of battery strings in a battery system.

At (304), the max string current associated with the plurality of battery strings is monitored. For instance, when only the first battery string is coupled to the charger, the string current associated with the first battery string can be monitored. The charging voltage provided by the charger can be controlled based at least in part on the max string current (306).

It can be determined whether the charging voltage exceeds a battery string voltage of one or more battery strings at (308). If not, the method can continue to control the charging voltage based on the max string current as shown at (306). If so, the method can couple the second battery string to the charger (310). The method can continue to control the charging voltage based on the max string current (306) after the second battery string is coupled to the charger. The max string current can be the highest string current of the plurality of battery strings coupled to the charger. Additional second battery strings can be coupled to the charger as the charging voltage exceeds the battery string voltage of the additional second battery strings. The method can continue in this manner to sequentially couple one or more second battery strings to the charger in ascending order of battery string voltage.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A battery system, comprising:
   one or more control devices configured to control a charging output of a charger based at least in part on a string current of at least one of a plurality of battery strings, wherein the charging output is set to a minimum string voltage and increases based on feedback from the plurality of battery strings;
   wherein the one or more control devices is configured to control a plurality of battery string contactors, each battery string contactor associated with at least one of the plurality of battery strings, to sequentially couple each of the plurality of battery strings to the charger when a charging voltage of the charger exceeds a battery string voltage associated with the battery string; and
   wherein the one or more control devices is configured to sequentially couple the plurality of battery strings to the charger in ascending order of battery string voltage.

2. The battery system of claim 1, wherein the one or more control devices are configured to control the charging output of the charger based at least in part on a string current limit.

3. The system of claim 1, wherein the charging output comprises the charging voltage output by the charger.

4. The system of claim 3, wherein the one or more control devices are configured to control the charging output of the charger based at least in part on a charging voltage limit.

5. The system of claim 1, wherein the charging output comprises a charging current output by the charger.

6. The battery system of claim 1, wherein the one or more control devices are configured to open the plurality of battery string contactors prior to charging the plurality of battery strings.

7. The battery system of claim 1, wherein the one or more control devices are configured to first couple the battery string having a lowest battery string voltage to the charger.

8. A method for connecting a plurality of battery strings to a charger, each battery string including two or more batteries or battery cells connected in series or parallel configuration, the method comprising:
   coupling a first battery string of a plurality of battery strings to a charger;
   monitoring a string current for the first battery string;
   controlling, by one or more control devices, a charging voltage provided by the charger based at least in part on the string current for the first battery string, wherein the charging voltage is set to a minimum string voltage and increases based on feedback from the plurality of battery strings;
   coupling a second battery string to the charger when the charging voltage is greater than a voltage of the first battery string; and
   sequentially coupling additional battery strings to the charger when the charging voltage exceeds the battery string voltage associated with the previously coupled battery strings.

9. The method of claim 8, wherein coupling the second battery string to the charger comprises closing a contactor coupled in series with the second battery string.

10. The method of claim 8, wherein the charging voltage is controlled based at least in part on a charging voltage limit.

11. The method of claim 8, wherein the charging voltage is controlled based at least in part on a string current limit.

12. The method of claim 8, wherein the first battery string has a lowest battery string voltage of the plurality of battery strings.

* * * * *